United States Patent [19]
Fujita

[11] Patent Number: 5,737,269
[45] Date of Patent: Apr. 7, 1998

[54] SEMICONDUCTOR MEMORY WITH BURST MODE FEATURE FOR THE REDUNDANT MEMORY AREA

[75] Inventor: Mamoru Fujita, Tokyo, Japan

[73] Assignee: NEC Corporation, Tokyo, Japan

[21] Appl. No.: 534,995

[22] Filed: Sep. 27, 1995

[30] Foreign Application Priority Data

Sep. 28, 1994 [JP] Japan ................................. 6-257332

[51] Int. Cl.$^6$ ........................................ G11C 7/00
[52] U.S. Cl. ............................ 365/200; 365/230.03
[58] Field of Search ........................ 365/200, 230.03; 371/10.3, 10.2; 326/10; 327/526

[56] References Cited

U.S. PATENT DOCUMENTS

| | | | |
|---|---|---|---|
| 4,473,895 | 9/1984 | Tatematsu | 365/200 |
| 4,577,294 | 3/1986 | Brown et al. | 365/200 |
| 4,803,656 | 2/1989 | Takemae | 365/200 |
| 4,989,181 | 1/1991 | Harada | 365/200 |
| 5,261,064 | 11/1993 | Wyland | 395/421.01 |
| 5,278,794 | 1/1994 | Tanaka et al. | 365/185.17 |
| 5,307,316 | 4/1994 | Takemae | 365/200 |
| 5,319,759 | 6/1994 | Chan | 395/421.07 |
| 5,414,659 | 5/1995 | Ito | 365/200 |
| 5,500,821 | 3/1996 | Tanaka | 365/200 |
| 5,568,432 | 10/1996 | Wada | 365/200 |
| 5,572,470 | 11/1996 | McClure et al. | 365/200 |
| 5,576,633 | 11/1996 | Rountree et al. | 326/10 |

*Primary Examiner*—Tod R. Swann
*Assistant Examiner*—Christopher S. Chow
*Attorney, Agent, or Firm*—Sughrue, Mion, Zinn, Macpeak & Seas, PLLC

[57] ABSTRACT

In a semiconductor memory, the output of a ROM (Read Only Memory) storing the address of replacement with a redundant cell is compared with the leading address of a burst input to the memory from the outside. A signal representative of the coincidence the leading address and the replaced address is attained without waiting for the generation of internal addresses, so that a rapid access to a redundant cell array is achievable. The replacement to the redundant cell is effected collectively on a burst length basis. Alternatively, the replacement may be effected by activating the cell array with the coincidence signal, then comparing the internal addresses generated later with the replaced address in the burst, and then switching the input and output portion of each array.

13 Claims, 6 Drawing Sheets

SEMICONDUCTOR MEMORY WITH BURST MODE FEATURE FOR THE REDUNDANT MEMORY AREA

BACKGROUND OF THE INVENTION

The present invention relates to a semiconductor memory having a burst mode and, more particularly, to a semiconductor memory capable of accessing redundant cells at high speed.

Today, the increasing scale and fineness of semiconductor memories have made it difficult to produce cell arrays entirely free from defects. A memory is not acceptable as a product unless all the cells thereof are accurately operable. Hence, a chip should be discarded if even a single bit thereof is defective. In light of this, it has been customary with 1 megabit DRAMs (Dynamic Random Access Memories) and successive generations to dispose a redundant cell array in a chip. When a defective cell or cells are found in the chip by conditioning after production, they are replaced with cells included in the redundant cell array. This prevents the chip with some defective cells from being entirely wasted. For the replacement of the defective cells with the redundant cells, the defective cells are written in a ROM (Read Only Memory) mounted on the chip. Generally, to write the defective addresses in the ROM, fuses for designating defective addresses and provided on the chip are cut off by a laser beam or an excess current.

During the course of operation of the memory, an address signal input from the outside of the chip is compared with defective addresses, or replaced addresses as referred to hereinafter, written to the ROM at the time of replacement. If the input address signal is coincident with any one of the replaced addresses, data are written in or read out of redundant cells designated by the replaced address.

Usually, a plurality of addresses physically close to each other in the chip are collectively replaced with the redundant cells. Hence, in the replaced addresses, a part of the bits for distinguishing the individual addresses are not designated. However, despite the physically adjoining positions, addresses input from the outside are not necessarily close to each other.

A burst access system is available with a synchronous DRAM or similar semiconductor memory in order to increase the reading and writing speed. The burst access system allows data to be sequentially written to or read out of a plurality of addresses only if the leading address is designated. The length of a sequence of data to be read out is referred to as a burst length. Because only the leading address for a burst operation is input from the outside to the memory, the addresses following the leading address are generated within the memory. Let the input address or leading address and the following addresses generated in the memory be referred to as an external address and internal addresses, respectively. The internal addresses are applied to a memory cell array.

When replacement is effected with a redundant cell array on the basis of the burst operation, the replaced address does not always coincide with the external address, i.e., it sometimes coincides with one of the internal addresses. For this reason, the internal address and replaced address are compared in a redundancy circuit. Generally, the burst length is $2^m$. Among the bits constituting the external address (n bits), m bits are representative of the addresses of the data lying in the burst length, while the other bits are representative of the divisions between the consecutive burst data groups; let the former and the latter be referred to as inside-burst addresses and outside-burst addresses, respectively.

It is a common practice with a semiconductor memory implemented by the burst access system to access only the redundant cells for the replaced addresses and to access the regular cells for the non-replaced addresses during the course of writing or reading operation. This kind of scheme, however, makes it difficult to enhance rapid access to the redundant cells.

SUMMARY OF THE INVENTION

It is, therefore, an object of the present invention to provide a semiconductor memory with a burst mode and enhancing rapid access to redundant cells.

In accordance with the present invention, a semiconductor memory having a burst access function for continuously accessing a plurality of data has an internal address generating circuit for receiving only the leading address, and generating a plurality of internal addresses based on the leading address. A regular cell array receives the internal addresses. A redundant cell array substitutes redundant cells thereof for defective cells included in the regular cell array. A storage device stores information representative of the substitution of the redundant cells for the defective cells beforehand. A comparing circuit compares an address input to the memory from the outside and the information stored in the storage device. A controller causes the regular cell array and redundant cell array to be selectively accessed on the basis of the result of comparison output from the comparing circuit.

Also, in accordance with the present invention, a semiconductor memory has an internal address generating circuit for receiving a first address from the outside of the memory, and sequentially generating a plurality of second addresses including the first address and each having a part of bits constituting the first address. A regular cell array has a plurality of memory cells each having a particular address. A circuit is provided for sequentially writing or reading data in or out of the memory cells of the regular cell array which are designated by the second addresses. A storage device stores at least a part of a bit sequence constituting the address of a defective cell of the regular cell array beforehand. A comparing circuit compares the bit sequence stored in the storage device and bit sequences corresponding to the part at the first address, and outputs a first coincidence signal if the bit sequences compare equal. A redundant cell array is activated by the first coincidence signal and used in place of the defective cell of the regular cell array.

Further, in accordance with the present invention, a semiconductor memory having a burst access function for continuously accessing a plurality of data has an internal address generating circuit for receiving only the leading address, and generating a plurality of internal addresses based on the leading address. A regular cell array receives the internal addresses. A redundant cell array substitutes its redundant cells for defective cells included in the regular cell array. A first storage device stores address information representative of a replaced address and having a predetermined bit sequence beforehand. A second storage device stores replaced address information corresponding to the internal addresses beforehand. A controller effects, when a predetermined bit sequence of the first address and the address information of the first storage device are coincident and if the internal addresses are coincident with the replaced address information of the second storage, input or output of data to or from the redundant cells.

Moreover, in accordance with the present invention, a semiconductor memory has an internal address generating circuit for receiving a first address from the outside of the memory, and sequentially generating a plurality of second addresses including the first address and each having a part of bits constituting the first address. A regular cell array has a plurality of memory cells each having a particular address. A circuit is provided for sequentially writing or reading data in or out of the memory cells of the regular cell array which are designated by the second addresses. A first storage device stores at least a part of a bit sequence constituting the address of a defective cell of the regular cell array beforehand. A first comparing circuit compares the bit sequence stored in the first storage device and a bit sequence corresponding to the bit sequence at the first address, and for outputting a first coincidence signal if the bit sequences compare equal. A redundant cell array is activated by the first coincidence signal and used in place of the defective cell of the regular cell array. A second storage device stores, among the bit sequences respectively constituting the second addresses, different bit groups. A second comparing circuit compares the bit groups stored in the second storage device and bit groups of the second addresses corresponding to the bit groups and outputs, if the bit groups compare equal, a second coincidence signal. A circuit is provided which is responsive to the second coincidence signal for suppressing an input or an output between one of the regular cell array and redundant cell array and the outside.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
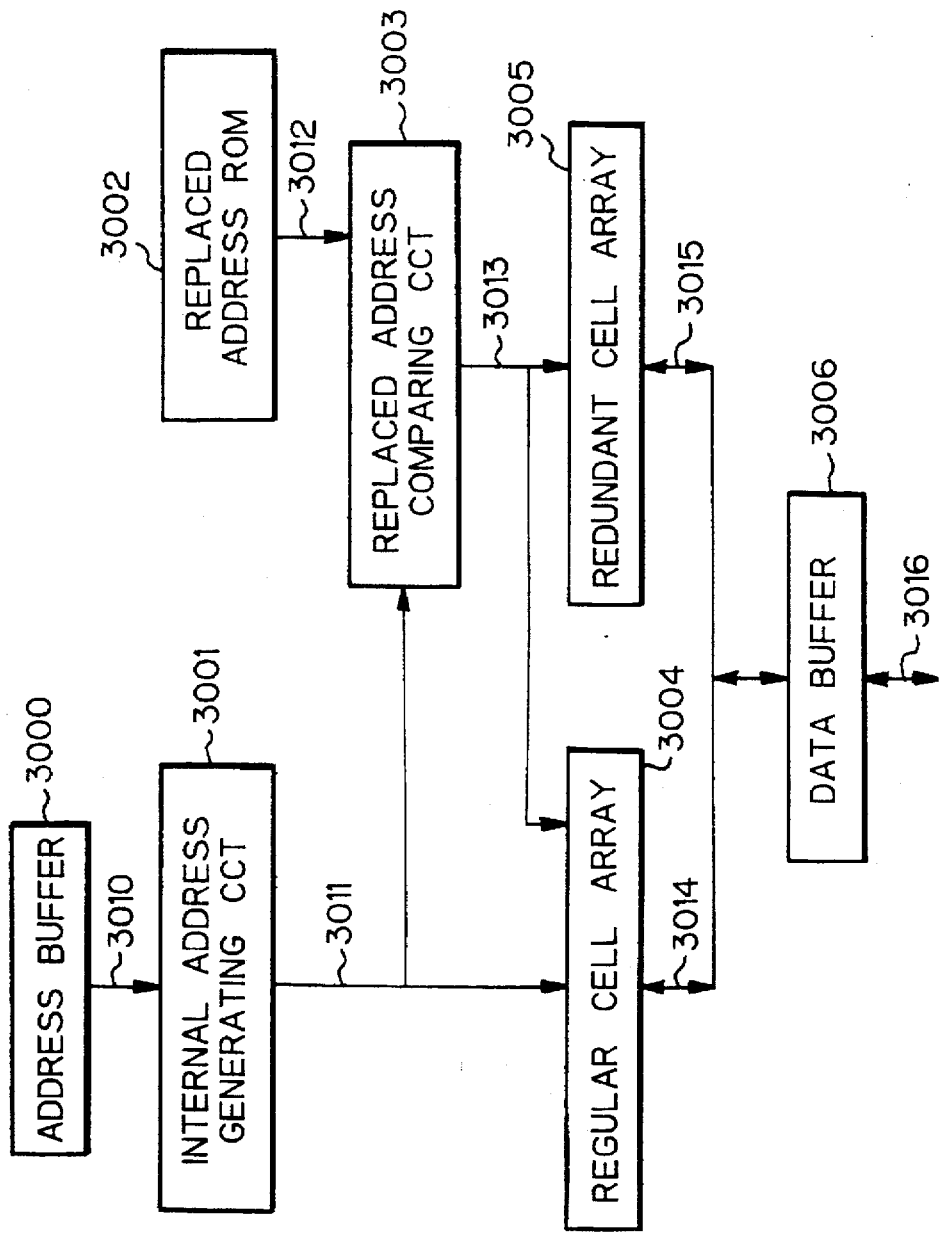
FIG. 1 is a block diagram schematically showing a conventional semiconductor memory.

To better understand the present invention, a brief reference will be made to a conventional semiconductor memory with a burst access system, shown in FIG. 1. As shown, an address from the outside of a chip is input to an address buffer 3000. In response, the address buffer 3000 generates an external address signal 3010 and feeds it to an internal address generating circuit 3001. The internal address generating circuit 3001 sequentially generates a group of internal address signals 3011 including the input external address. A replaced address comparing circuit 3003 compares the internal address signal 3011 with a replaced address signal 3012 output from a replaced address ROM 3002. If the former is coincident with the latter, the comparing circuit 3003 outputs a coincidence signal 3013. The number of bits of the signal 3012 is equal to or smaller than the number of bits of the signal 3011.

If the number of bits of the signal 3012 is smaller than that of the signal 3011, the coincidence signal 3013 is output for the bits not present in the signal 3012 without regard to the values of the corresponding bits of the signal 3011. As a result, the coincidence signal 3013 is output for a plurality of internal addresses. Subsequently, if the signal 3011 is coincident with the signal 3012, the coincidence signal 3013 is activated. The active signal 3013 is input to a regular cell array 3004 to make it inactive and, at the same time, input to a redundant cell array 3005 to make it active. It is to be noted that to activate a cell array means to connect memory cells designated by the signal 3011 to a data driver or a data receiver located outside of the cell array, thereby preparing the circuitry for writing or reading data in or out of a data bus.

Figure 2:
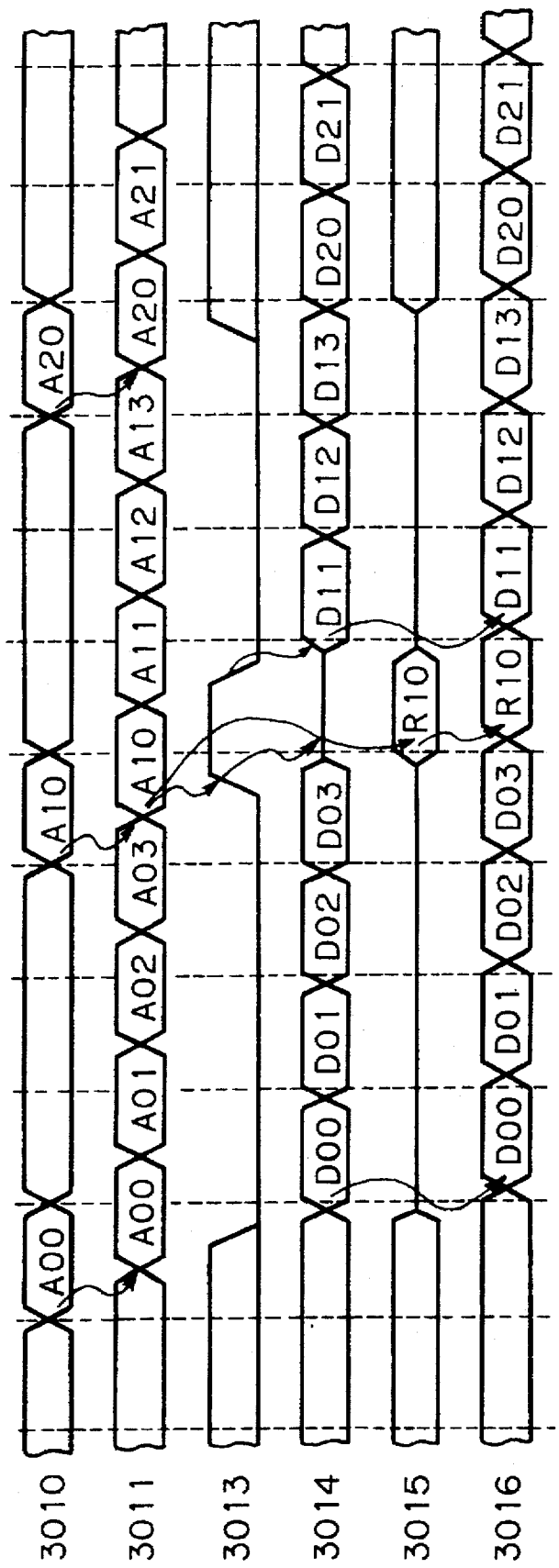
FIG. 2 is a timing chart demonstrating a specific operation of the memory of FIG. 1.

A specific operation of the conventional memory will be described with reference also made to FIG. 2. Assume that the burst length is four bytes. Then, when the leading address A00 is input to the internal address generating circuit 3001 as an external address signal 3010, the circuit 3001 sequentially generates a group of internal address signals (A00–A03). Because the coincidence signal 3013 is inactive, the regular cell array 3004 is accessed. In this condition, data D00–D03 are output from a regular cell input/output signal 3014 via a data buffer 3006 as a chip input/output signal 3016. At this instant, the redundant cell array 3005 held inactive has its output 3015 maintained in a high impedance state.

Subsequently, on receiving the next leading address A10 as another external address signal 3010, the address generating circuit 3001 outputs A10 as an internal address signal 3011. The comparing circuit 3003 compares the signal 3011 with the replaced address signal 3012 stored in the ROM 3002. As a result, the coincidence signal 3013 is made active, so that data R10 (redundant cell input/output signal 3015) is read out of the redundant cell array 3005. The data R10 is output via the data buffer 3006 as a chip input/output signal 3016. For the internal address signals 3011 (A11–A13) following A10, the coincidence signal 3013 goes inactive or low. Consequently, the regular cell array 3004 is activated. In this condition, data D11–D03 are output from the regular cell input/output signal 3014 via the data buffer 3006 as a chip input/output signal 3016. In this way, the writing/reading operation is executed only with the redundant cells for the replaced address or only with the regular cells for the non-replaced address.

As stated above, data are read out of regular cells by the steps of receiving an external address, generating internal addresses on the basis of the external address, activating a regular cell array by the internal addresses, and reading data out of the regular cell array. On the other hand, data are read out of replaced redundant cells by the steps of receiving an external address, generating internal addresses based on the external address, comparing the internal addresses with the replaced address to thereby output a coincidence signal, activating a redundant cell array on the basis of the coincidence signal, and reading data out of the redundant cell array. In practice, considering the presence of redundant cells, the precondition that a coincidence signal is not generated as a result of address comparison also applies to the read-out of data from the regular cell array.

The above sequences of steps are executed in a time-serial fashion, i.e., the latter sequence cannot be started unless the former sequence is completed. Hence, the operation speed of the memory and, therefore, the speed of the entire chip is lower than when data are read out of regular cells without address comparison.

Figure 3:
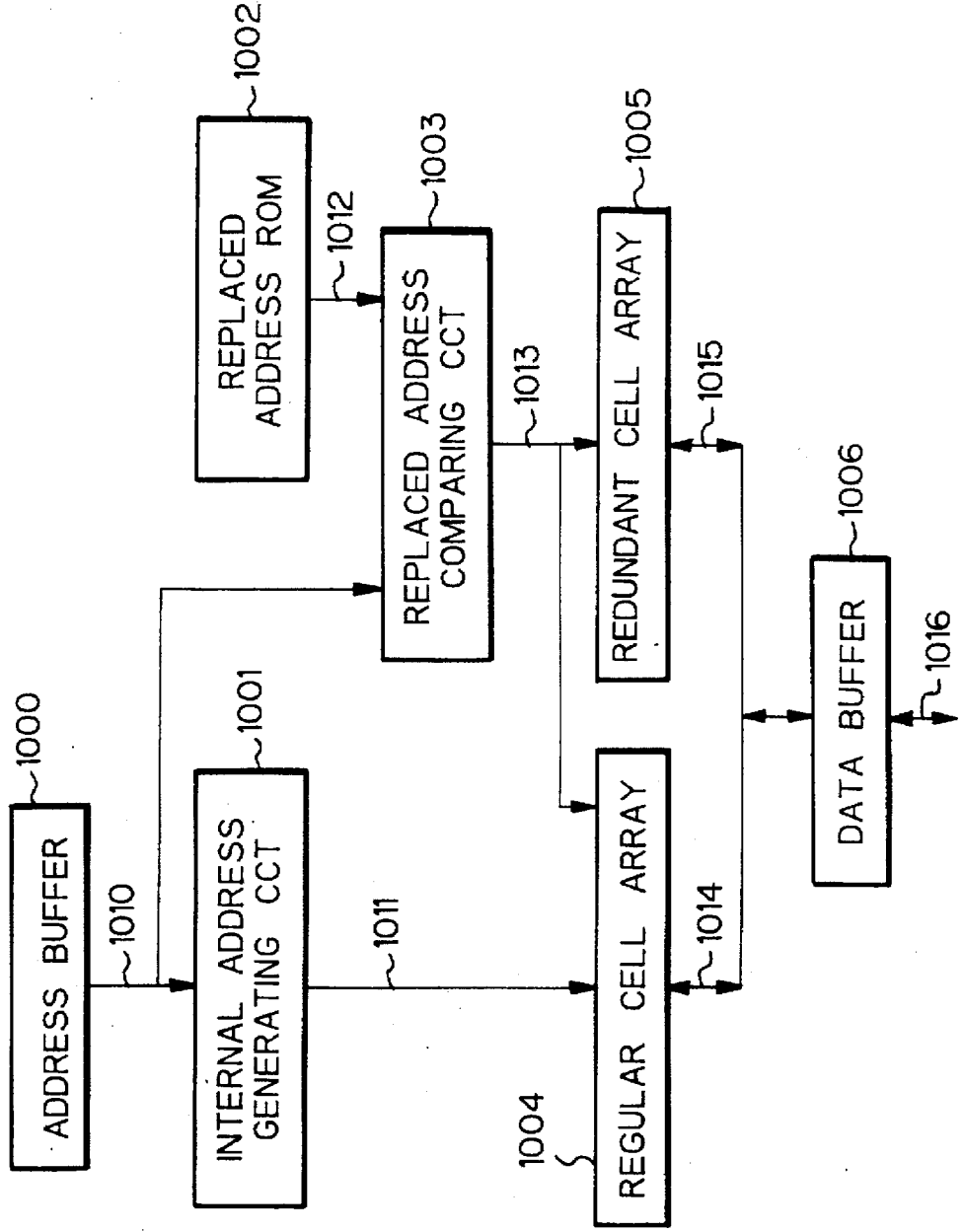
FIG. 3 is a block diagram schematically showing a semiconductor memory embodying the present invention.

Referring to FIG. 3, a semiconductor memory embodying the present invention will be described. As shown, an address buffer 1000 receives an address from the outside of a chip and, in response, outputs an external address signal 1010. The address signal 1010 is applied to an internal address generating circuit 1001. The internal address generating circuit 1001 sequentially generates a group of internal address signals 1011 including the input external address signal 1010. A replaced address comparing circuit 1003 compares, substantially at the same time as the generation of the address signal group 1011, the address signal 1010 with a replaced address signal 1012 output from a replaced address ROM 1002. If the former is coincident with the latter, the comparing circuit 1003 outputs a coincidence signal 1013.

The bits of the replaced address signal 1012 do not include bits representative of an inside-burst address. In the comparing circuit 1003, the bits corresponding to the inside-burst address of the external address signal 1010 are excluded from comparison. Hence, the same comparison signal 1013 appears for all the external address signals 1010 having the same outside-burst address.

If the external address signal 1010 and replaced address signal 1012 are coincident as to the outside-burst address, the coincidence signal 1013 becomes active. As a result, a redundant cell array 1005, to which the signal 1013 is input, is activated. In this case, a regular cell array 1004 is inactivated and has its output held in a high impedance state.

The replacement is executed over the entire burst length at a time. Specifically, when the external address signal 1010 representative of the leading address is coincident with the replaced address, the redundant cell array 1005 is accessed for all the data in the leading address and successive addresses of the entire burst length.

A specific operation of the illustrative embodiment will be described with reference also made to FIG. 4. As shown, assume that a burst length is four bytes. When the leading address A00 is input as an external address signal 1010, the comparing circuit 1003 compares the address signal 1010 with the replaced address signal 1012 of the ROM 1002. Also, the internal address generating circuit 1001 sequentially generates internal address signals 1011 (A00–A03). Because the coincidence signal 1013 is inactive, the regular cell array 1004 is accessed. As a result, data D00–D03 are read out of a regular cell input/output signal 1014 and output via a data buffer 1006 as a chip input/output signal 1016.

When the next leading address A10 is input as another external address signal 1010, the comparing circuit 1003 compares it with the replaced address 1012 of the ROM 1002. Because the former is coincident with the latter, the coincident signal 1013 goes active or high. In response to the address signal 1010, the address generating circuit 1001 sequentially outputs internal addresses A10–A13 as internal address signals 1011. As a result, data R10–R13 (redundant cell input/output signal 1015) read out of the redundant cell array 1005 are output via the data buffer 1006 as a chip input/output signal 1016.

Figure 4:
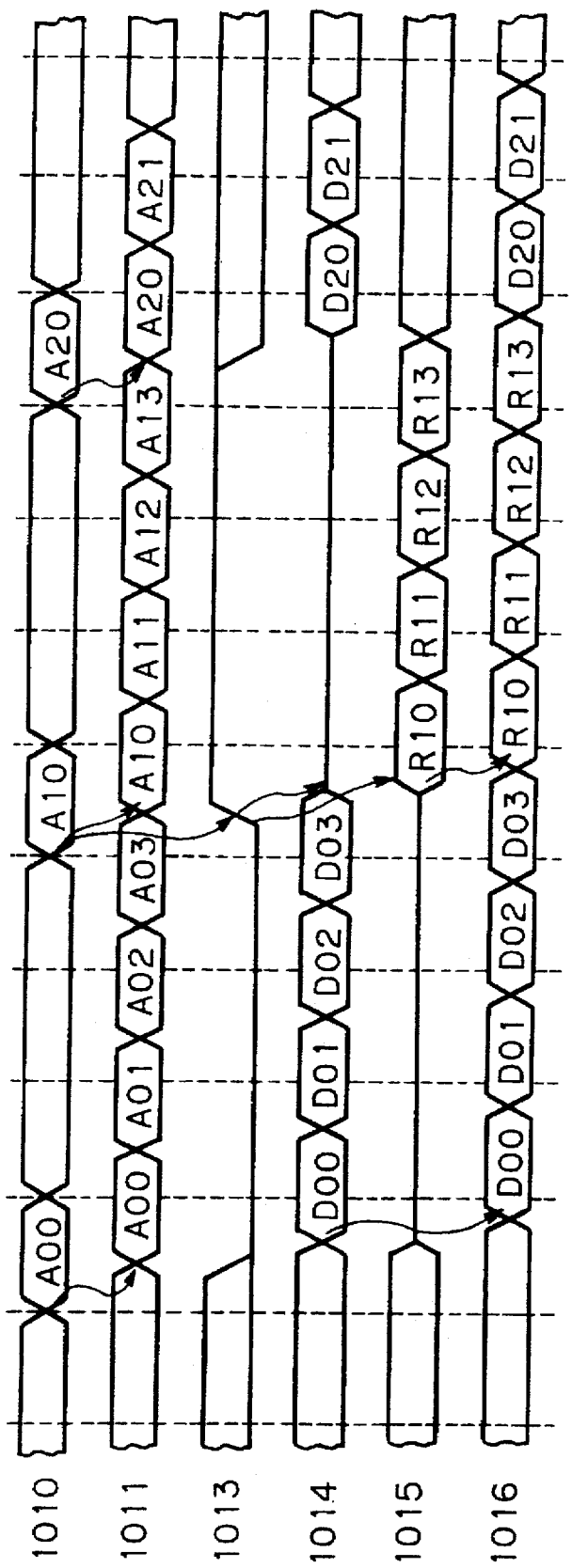
FIG. 4 is a timing chart representative of a specific operation of the embodiment.

As shown in FIG. 4, when the leading address signal A10 is input as an external address signal 1010, the coincidence signal 1013 goes high without any substantial delay from the internal address signals 1011 output from the address generating circuit 1001.

While the foregoing description has concentrated on a read mode operation, the embodiment performs a write mode operation in the same manner. When the external address signal 1010 is coincident with the replaced address, the embodiment continuously writes or read data in or out of only the redundant cells in the burst width. When the signal 1010 is not coincident with the replaced address, the embodiment writes or read data in or out of the regular cells.

As stated above, before internal address signals are generated, a coincidence signal is attained via the comparison of an external address signal and a replaced address. The embodiment, therefore, realizes a shorter access time than the conventional semiconductor memory. Further, in the embodiment, redundant cells are accessed over the entire burst length at a time without regard to the internal address signals to be generated by the address generating circuit 1001. Hence, it is not necessary to wait for the generation of the internal address signals, and the address is not compared with the replaced address for each of the internal address signals. It follows that the replaced address is compared with the internal address signals a minimum number of times, enhancing high-speed access.

An alternative embodiment of the present invention will be described with reference to FIG. 5. As shown, the memory has a regular cell array 2004 and a redundant cell array 2005. An outside-burst replaced address ROM 2002 stores outside-burst bits representative of a replaced address. For the activation of the redundant cell array 2005, a replaced address comparing circuit 2003 compares a replaced address signal 2012 output from the ROM 2002 and the outside-burst bits of an external address signal 2010. The outside-burst replaced signal 2012 does not include bit data representative of addresses in the burst length (e.g. lower m bits when the burst length is $2^m$), but it is constituted only by a bit group constituting an outside-burst address. When the comparing circuit 2003 outputs a coincidence signal 2013, an inside-burst replaced address signal 2017 is read out of an inside-burst replaced address ROM 2007. The address signal 2017 shows which of the addresses lying in the burst length and designated by the address signal 2012 should be replaced. The coincidence signal 2013 is input to the redundant cell array 2005 and ROM 2007, but it is not input to the regular cell array 2004.

With the above configuration, the embodiment does not execute control over the inactivation of the regular cell array 2004 using the coincidence signal 2013. Hence, when the coincidence signal 2013 goes active, the regular cell array 2004 is not inactivated. That is, both the regular cell array 2004 including defective bits and the redundant cell array 2005 including the replaced addresses are activated at the same time.

Figure 5:
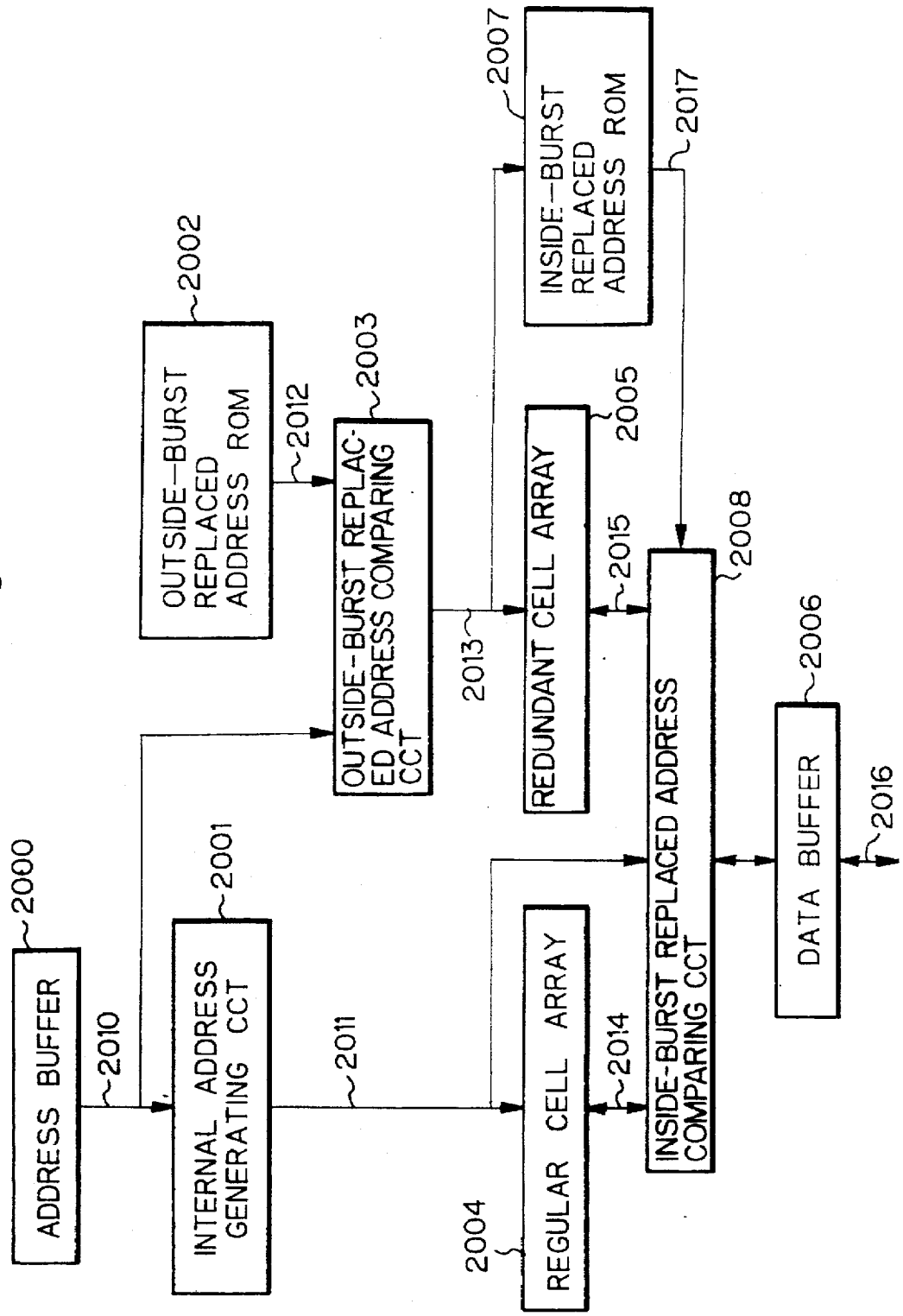
FIG. 5 is a block diagram schematically showing an alternative embodiment of the present invention.

As shown in FIG. 5, the input/output signal 2014 of the regular cell array 2004 and the input/output signal 2015 of the redundant cell array 2005 are each connected to an input/output selecting circuit 2008 by a respective bidirectional bus. The inside-burst replaced address signal 2017 from the ROM 2007 is input to the selecting circuit 2008. The selecting circuit 2008 compares the internal address signal 2011 with the address signal 2017. The selecting circuit 2008 writes or reads data in or out of the regular array 2004 if the signals 2017 and 2011 do not compare equal or writes or reads data out of the redundant array 2005 if they compare equal.

Figure 6:
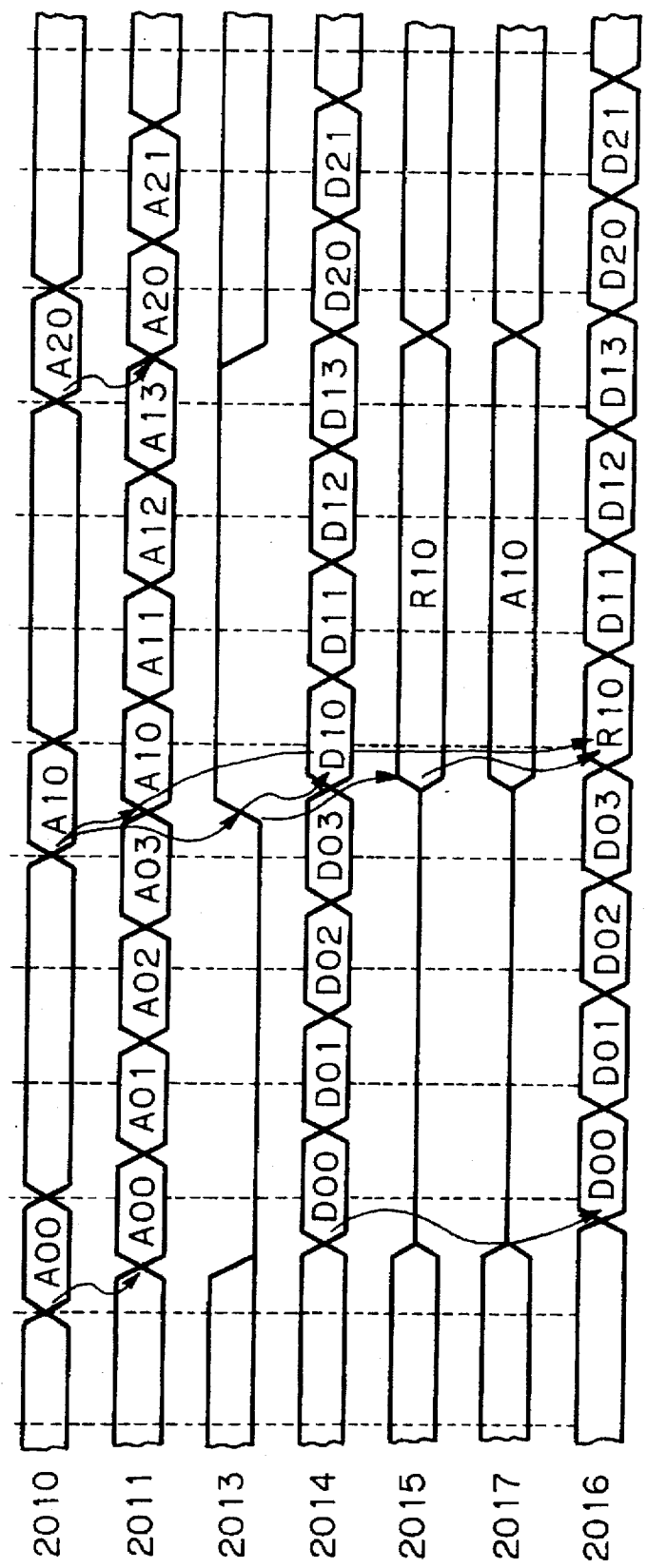
FIG. 6 is a timing chart demonstrating a specific operation of the alternative embodiment.

FIG. 6 demonstrates a specific operation of the alternative embodiment. Again, the burst length is assumed to be four bytes. As shown, when the leading address A00 is input as an external address signal 2010, it is compared with the replaced address signal 2012 of the ROM 2002 by a replaced address comparing circuit 2003. An internal address generating circuit 2001 sequentially generates internal address signals 2011 (A00–A03). In this condition, data D00–D03 are sequentially read out of the regular cell array 2004 and output via the selecting circuit 2008 and a data buffer 2006 as a chip input/output signal 2016.

Subsequently, when the next leading address A10 is input as another external address signal 2010, it is compared with the replaced address signal 2012 (=outside-burst address) of the ROM 2002 by the comparing circuit 2003. Because the signals 2010 and 2012 compare equal, the coincidence signal 2013 goes active or high. As a result, the redundant cell array 2005 is activated. Further, the inside-burst replaced address signal 2017 is read out of the ROM 2007 and input to the selecting circuit 2008.

The address generating circuit 2001 sequentially generates internal addresses A10–A13 as internal address signals 2011. As a result, data D10–D13 read out of the regular cell array 2004 and data R10 read out of the redundant cell array 2005 are applied to the selecting circuit 2008. Because the inside-burst replaced address signal 2017 is representative of the address A10, the selecting circuit 2008 selects the data of the redundant array 2005 (redundant cell input/output signal 2015) for the address designated by A10 or selects the data of the regular array 2004 (input/output signal 2014) for the other addresses of the burst. Consequently, the data R10, D11, D12 and D13 are output via the data buffer 2006 as a chip input/output signal 2016.

Because the previous embodiment effects the substitution of redundant cells on a burst length basis, it is not practicable if the burst length is greater than the addresses. Increasing the burst length would scale up the redundant cell array and, therefore, the chip area. By contrast, the alternative embodiment is free from this problem because the scale of the redundant cell array does not depend on the burst length, although control circuitry will be slightly complicated. In addition, because the alternative embodiment activates the redundant cell array by comparing the external address, it is comparable with the first embodiment as to the rapid accessing capability.

In summary, it will be seen that the present invention provides a semiconductor memory having various unprecedented advantages, as enumerated below.

(1) In a semiconductor memory having an internal address generating circuit for generating internal address signals based on an input external address signal, a burst access function, and a redundancy circuit for replacing a defective cell with a redundant cell, the replacement of an address to a redundant cell is effected by comparing the external address signal with a replaced address stored in a ROM. Hence, the comparison of the replaced address and the generation of internal addresses are effected at the same time. This successfully reduces the access time and thereby enhances rapid burst accesses.

(2) The memory allows redundant cells to be collectively accessed on a burst length basis without regard to the internal address signals. Hence, the external address signal can be compared with the replaced address without waiting from the generation of internal addresses. This, coupled with the fact that the replaced address is compared a minimum number of times, further enhances the rapid access to the redundant cells.

(3) A storage device stores an inside-burst replaced address showing which of the addresses covered by a burst length and designated by an outside-burst replaced address should be replaced. When the external address signal is coincident with the replaced address at the outside-burst address, the address is read out of the storage. When the internal address signal and the inside-burst replaced address are coincident, the redundant cell is accessed. Hence, because the scale of the redundant cell array does not depend on the burst length, the access time is reduced to implement high-speed burst operations.

Various modifications will become possible for those skilled in the art after receiving the teachings of the present disclosure without departing from the scope thereof.

What is claimed is:

1. A semiconductor memory having a burst access function for continuously accessing a plurality of data, comprising:

an internal address generating circuit for receiving only a leading address, and for generating a plurality of internal addresses based on said leading address;

a regular cell array to which said plurality of internal addresses are applied;

a redundant cell array for substituting redundant cells thereof for defective cells included in said regular cell array;

storing means for storing information representative of substitution of said redundant cells for said defective cells;

a comparing circuit which compares substantially simultaneously with generation of said plurality of internal addresses by said internal address generating circuit, said information stored in said storing means only with said leading address supplied to both said comparing circuit and said internal address generating circuit; and control means for causing said regular cell array and said redundant cell array to be selectively accessed on the basis of a result of a comparison output from said comparing circuit.

2. The semiconductor memory as claimed in claim 1, wherein said control means is arranged to provide selective access to said redundant cell array on the basis of a burst length.

3. The semiconductor memory as claimed in claim 1, wherein said storing means comprises a programmable ROM.

4. A semiconductor memory comprising:

an internal address generating circuit for receiving a first address from outside of said semiconductor memory, and for sequentially generating a plurality of second addresses, including said first address, each having a portion of bits which constitute said first address;

a regular cell array comprising a plurality of memory cells each having a particular address;

means for sequentially performing one of writing and reading of data in or out of said plurality of memory cells of said regular cell array which are designated by said second addresses;

storing means for storing at least a part of a bit sequence constituting an address of a defective cell of said regular cell array;

a comparing circuit for comparing, substantially simultaneously with generation of said plurality of second addresses by said internal address generating circuit, said bit sequence stored in said storing means and bit sequences corresponding only to a part of said first address, supplied to both said comparing circuit and said internal address generating circuit from outside of said semiconductor memory, and for outputting a first coincidence signal when said bit sequences coincide; and a redundant cell array which is activated by said first coincidence signal and which is used in place of said defective cell of said regular cell array.

5. The semiconductor memory as claimed in claim 4, wherein said bit sequence stored in said storing means comprises only common bits of said second address.

6. The semiconductor memory as claimed in claim 4, wherein said storing means comprises a programmable ROM.

7. A semiconductor memory having a burst access function for continuously accessing a plurality of data, comprising:

- an internal address generating circuit for receiving only a leading address, and for generating a plurality of internal addresses based on said leading address;
- a regular cell array to which said plurality of internal addresses are applied;
- a redundant cell array for substituting redundant cells thereof for defective cells included in said regular cell array;
- first storing means for storing address information representative of a replaced address and having a predetermined bit sequence;
- second storing means for storing replaced address information corresponding to said plurality of internal addresses; and
- control means for effecting, when a predetermined bit sequence of said leading address and said address information of said first storing means are coincident and when said internal addresses are coincident with said replaced address information of said second storing means, one of input data and output data to or from said redundant cells.

8. The semiconductor memory as claimed in claim 7, wherein said control means causes said regular cell array to be accessed when said predetermined bit sequence of said leading address and said address information of said first storing means are coincident.

9. The semiconductor memory as claimed in claim 8, further comprising a selecting circuit for selecting one of data of said regular cell array and data from said redundant cell array by comparing said internal addresses and said replaced address information of said second storing means.

10. The semiconductor memory as claimed in claim 7, wherein said address information of said first storing means comprise bit groups constituting said addresses other than bit groups designating the addresses lying in a burst group.

11. The semiconductor memory as claimed in claim 10, wherein said first and second storing means each comprises a programmable ROM.

12. A semiconductor memory comprising:

- an internal address generating circuit for receiving a first address from outside of said semiconductor memory, and for sequentially generating a plurality of second addresses, including said first address, each having a portion of bits which constitute said first address;
- a regular cell array comprising a plurality of memory cells each having a particular address;
- means for sequentially performing one of writing and reading of data in or out of said plurality of memory cells of said regular cell array which are designated by said second addresses;
- first storing means for storing at least a part of a bit sequence constituting an address of a defective cell of said regular cell array;
- a first comparing circuit for comparing said bit sequence stored in said first storing means and a bit sequence corresponding to said bit sequence at said first address, and for outputting a first coincidence signal when said bit sequences coincide;
- a redundant cell array which is activated by said first coincidence signal and which is used in place of said defective cell of said regular cell array;
- second storing means for storing, among the bit sequences respectively constituting said second addresses, different bit groups;
- a second comparing circuit for comparing said bit groups stored in said second storing means and bit groups of said second addresses corresponding to said bit groups and outputting, when said bit groups coincide, a second coincidence signal; and
- means responsive to said second coincidence signal for suppressing one of an input and an output between one of said regular cell array and said redundant cell array and the outside.

13. The semiconductor memory as claimed in claim 12, wherein said first and second storing means each comprises a programmable ROM.

* * * * *